United States Patent
Lin et al.

(10) Patent No.: US 6,225,160 B1
(45) Date of Patent: May 1, 2001

(54) METHOD OF MANUFACTURING BOTTOM ELECTRODE OF CAPACITOR

(75) Inventors: Kuo-Chi Lin, Lu-Chou; Kuo-Tai Huang, Hsinchu; Da-Wen Shia, Taipei; Kun-Chi Lin, Hsinchu, all of (TW)

(73) Assignee: United Microelectronics, Corp., Hsinchu (TW)

( * ) Notice: Subject to any disclaimer, the term of this patent is extended or adjusted under 35 U.S.C. 154(b) by 0 days.

(21) Appl. No.: 09/295,067

(22) Filed: Apr. 20, 1999

(51) Int. Cl.[7] ................................................ H01L 21/8242
(52) U.S. Cl. ........................................... 438/255; 438/398
(58) Field of Search ................................... 438/255, 257, 438/258, 259, 260, 261, 267, 695, 696, 700, 723, 724, 398

(56) References Cited

U.S. PATENT DOCUMENTS 6,066,893 * 5/2000 Wise ..................................... 257/751

* cited by examiner

*Primary Examiner*—David Nelms
*Assistant Examiner*—Quoc Hoang

(57) ABSTRACT

A method of manufacturing a bottom electrode of a capacitor. A first dielectric layer is formed on a substrate. A cap layer is formed on the first dielectric layer. A second dielectric layer is formed on the cap layer. A node contact hole is formed to penetrate through the second dielectric layer, the cap layer and the first dielectric layer. A liner layer is formed on a sidewall of the node contact hole. A restraining layer is formed on the second dielectric layer. A patterned conductive layer is formed on a portion of the restraining layer and fills the node contact hole. A selective hemispherical grained layer is formed on the patterned conductive layer.

20 Claims, 4 Drawing Sheets

METHOD OF MANUFACTURING BOTTOM ELECTRODE OF CAPACITOR

BACKGROUND OF THE INVENTION

1. Field of the Invention

The present invention relates to a method of manufacturing an integrated circuit. More particularly, the present invention relates to a method of manufacturing a bottom electrode of a capacitor of a DRAM.

2. Description of the Related Art

Typically, in order to meet the requirement of reducing the size of integrated circuits (ICs), a method used to increase the surface area of the capacitor on a substrate with a fixed surface area is developed. The method is to form a hemispherical grained (HSG) structure on the surface of the substrate to increase the surface area of the capacitor. A DRAM is taken as an example. When data are read by an amplifier, the more the charges in the capacitor of the DRAM are, the smaller the interference cause by the noise is. Moreover, the frequency for refreshing the storage charges is greatly reduced. Commonly, the method for fabricating the hemispherical grains in the ICs manufacturing process comprises forming a HSG layer on an amorphous silicon surface of a wafer selectively. Since the hemispherical grains are selectively formed, those can be called selective hemispherical grains.

FIG. 1 is schematic, cross-sectional view of a conventional bottom electrode of a capacitor with a HSG layer. As shown in FIG. 1, an oxide layer 110 is formed on a substrate 100 having previously formed field effect transistors 104 by chemical vapor deposition (CVD). A node contact hole 112 is formed to penetrate through the oxide layer 110 and exposing a portion of a source/drain region 108 of the field effect transistors 104. A doped amorphous silicon layer (not shown) is formed over the substrate 100 and fills the node contact hole 112. The doped amorphous silicon layer is patterned to form a doped amorphous silicon layer 114 used as a bottom electrode of the capacitor. A selective HSF layer 116 is formed on the doped amorphous silicon layer 114 to increase the surface area of the bottom electrode.

When the oxide layer 110 is formed by CVD, the oxide layer has many impurities such as hydrocarbon-bonds containing impurities. These impurities easily volatilize in the subsequent high temperature manufacturing steps. When the impurity vapor volatilizes from inside the oxide layer 110 to the surface thereof, outgassing happens.

Typically, high vacuum conditions must be maintained during the formation procedure of the HSG layer 116. When outgassing occurs during the formation procedure of the HSG layer 116, the vacuum quality of the furnace or the reaction chamber isadversely affected. Therefore, it is difficult to perform the nucleation to form hemispherical grains and the migration of the silicon atoms of the doped amorphous silicon layer 114 is also difficult. Hence, there are relatively fewer hemispherical grains and these hemispherical grains are relatively smaller. Therefore, the increase in surface area for the bottom electrode is limited.

Additionally, after the HSG layer 116 is formed, the native oxide layer (not shown) formed on the HSG layer 116 and the amorphous silicon layer 114 is removed by hydrofluoric acid. Then, the steps of forming a dielectric layer (not shown) and forming an upper electrode are performed. In order to completely remove the native oxide layer, an overetching process is performed. However, hydrofluoric acid also etches the oxide layer 110, so that a recess 118 in the oxide layer 110 due to the overetching with hydrofluoric acid easily occurs. Therefore, the reliability of the device is decreased. Moreover, it has no restraining layer on the oxide layer 110 to resist charge migration along the oxide layer 110. Therefore, a gate oxide layer (not shown) can easily capture the charges, so that the gate oxide layer decays.

SUMMARY OF THE INVENTION

The invention provides a method of manufacturing a bottom electrode of a capacitor to avoid outgassing and to improve the quality of the hemispherical grains formed on the bottom electrode. Additionally, by using the invention, the recess in the dielectric layer caused by the overetching process can be avoided. Moreover, the gate electrode can be prevented from collapsing.

To achieve these and other advantages and in accordance with the purpose of the invention, as embodied and broadly described herein, the invention provides a method of manufacturing a bottom electrode of a capacitor. A first dielectric layer is formed on a substrate. A cap layer is formed on the first dielectric layer. A second dielectric layer is formed on the cap layer. A node contact hole is formed to penetrate through the second dielectric layer, the cap layer and the first dielectric layer. A liner layer is formed on a sidewall of the node contact hole. A restraining layer is formed on the second dielectric layer. A patterned conductive layer is formed on a portion of the restraining layer and fills the node contact hole. A selective hemispherical grained layer is formed on the patterned conductive layer. Since the cap layer is formed on the first dielectric layer, the recess in the first dielectric layer caused by overetching will not occur. Moreover, the cap layer can restrain charge penetration and charge migration along the first dielectric layer, so that a gate electrode of a device can be prevented from collapsing. Additionally, because the material of the cap layer, the liner layer and the restraining layer can restrain outgassing from occurring at the first and the second dielectric layers while the patterned conductive layer and the selective hemispherical grained layer are formed, the quality of the selective hemispherical grained layer is relatively good.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
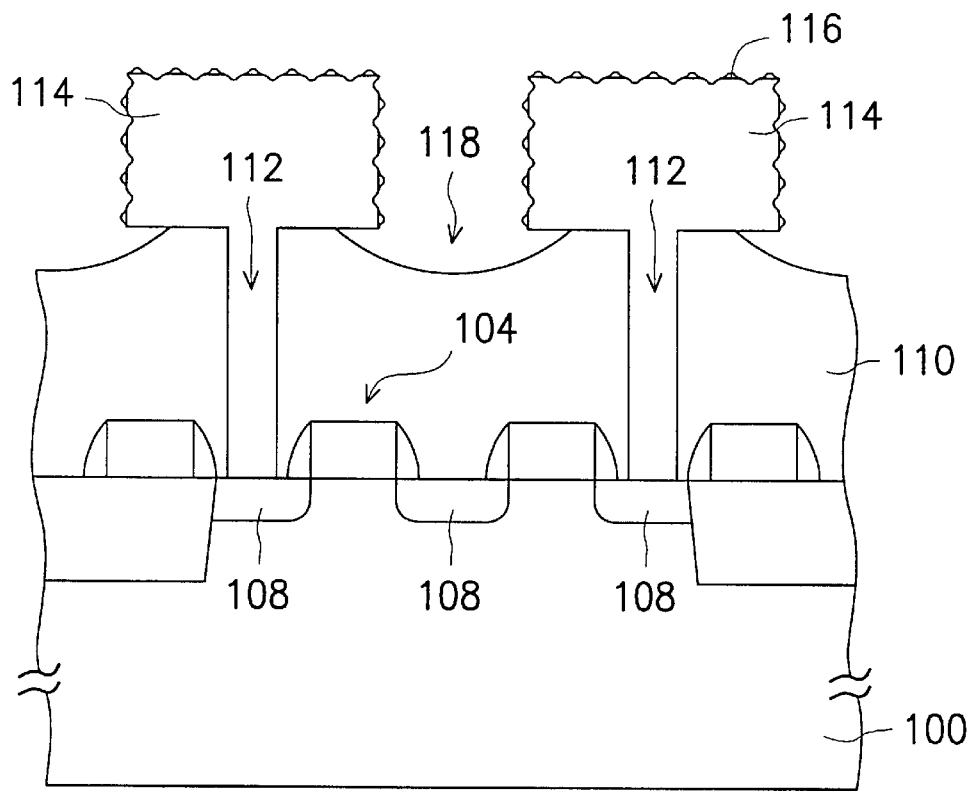
FIG. 1 is schematic, cross-sectional view of a conventional bottom electrode of a capacitor with a HSG layer.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic, cross-sectional views of the process for manufacturing a bottom electrode of a capacitor in a preferred embodiment according to the invention.

Figure 2A:
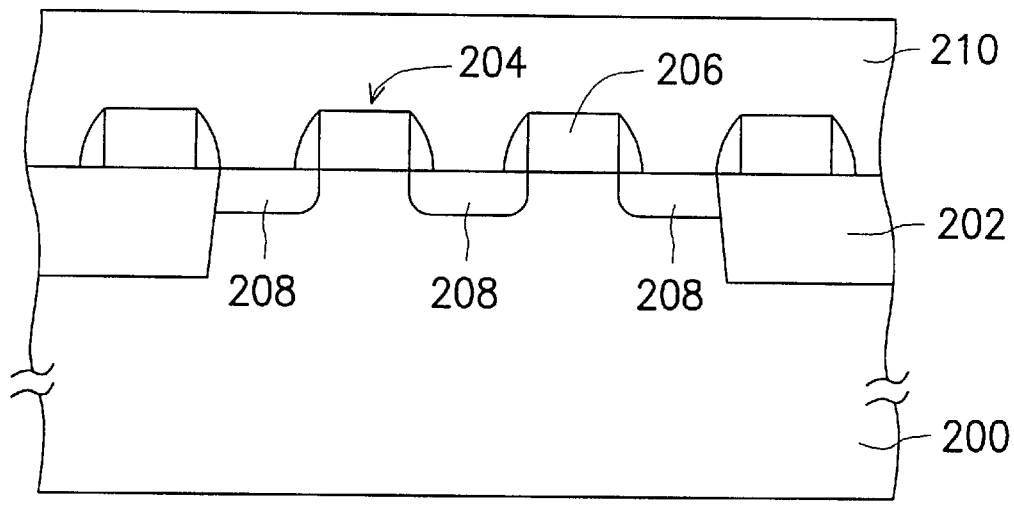
FIGS. 2A through 2E are schematic, cross-sectional views of the process for manufacturing a bottom electrode of a capacitor in a preferred embodiment according to the invention.

As shown in FIG. 2A, an isolation region 202 is formed on a substrate 200 to define an active region of a device in the substrate 200. Field effect transistors 204 are formed in the active region. Each field effect transistor 204 comprises a gate electrode 202 and a source/drain region 208. A dielectric layer 210 is formed over the substrate 200. The dielectric layer 210 can be formed from silicon oxide or borophosphosilicate glass (BPSG) by CVD, for example. Preferably, after the dielectric layer 210 is formed, it further comprises a planarizing process such as chemical-mechanical polishing (CMP), which is performed to planarize the dielectric layer 210.

Figure 2B:
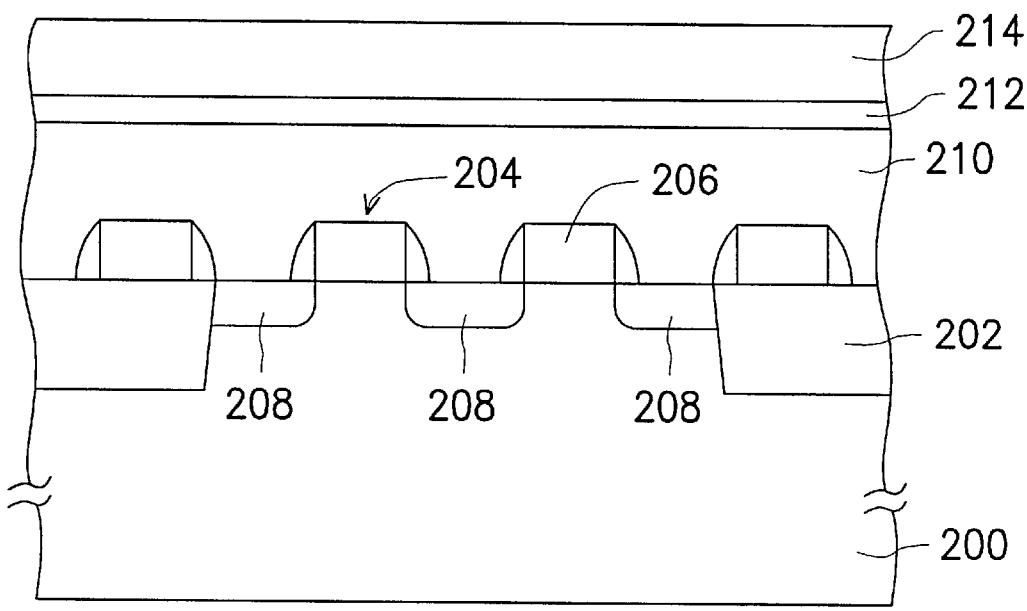

As shown in FIG. 2B, a cap layer 212 is formed on the dielectric layer 210. A dielectric layer 214 is formed on the cap layer 212. The material of the cap layer 212 can resist outgassing generated in the subsequent process. Additionally, the etching selective ratios of the cap layer 212 to dielectric layer 210 and the cap layer 212 to dielectric layer 214 are relatively good. Preferably, the cap layer 212 can be formed from silicon nitride or silicon-oxy-nitride by CVD, for example. The thickness of the cap layer 212 is about of 50–200 angstroms. The dielectric layer 214 can be formed from silicon oxide or BPSG by CVD, for example.

Figure 2C:
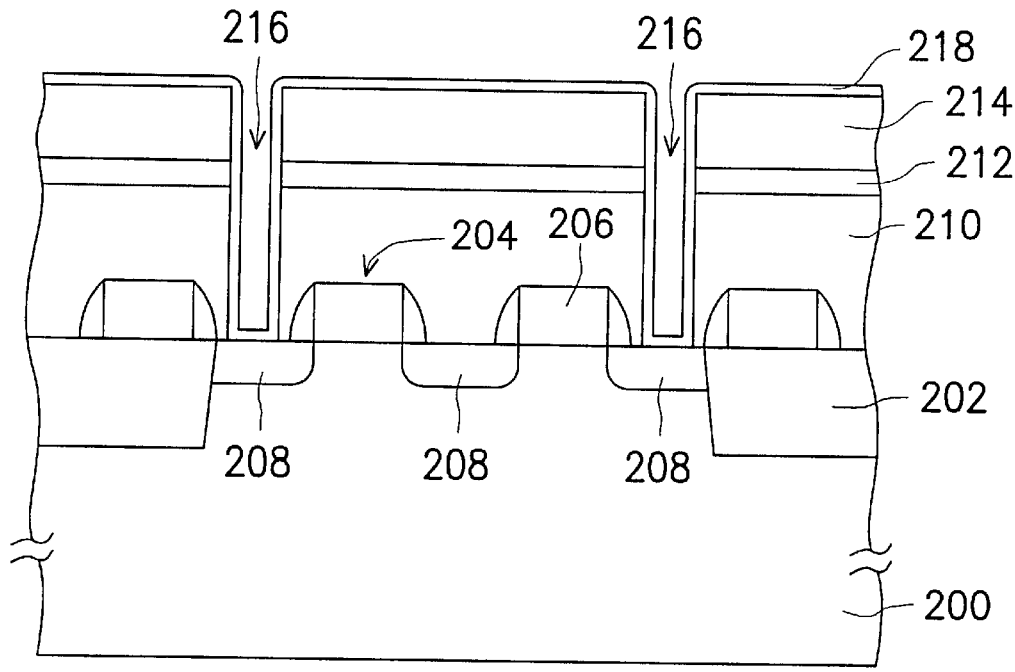

As shown in FIG. 2C, the dielectric layer 214, the cap layer 212 and the dielectric layer 210 are patterned to form a node contact hole 216. The node contact hole 216 penetrates through the dielectric layer 214, the cap layer 212 and the dielectric layer 210 and exposes a portion of the source/drain region 208. A conformal layer 218 is formed on the dielectric layer 214 and on the sidewall of the node contact hole 216 and on the portion of the source/drain region 208 exposed by the node contact hole 216.

Figure 2D:
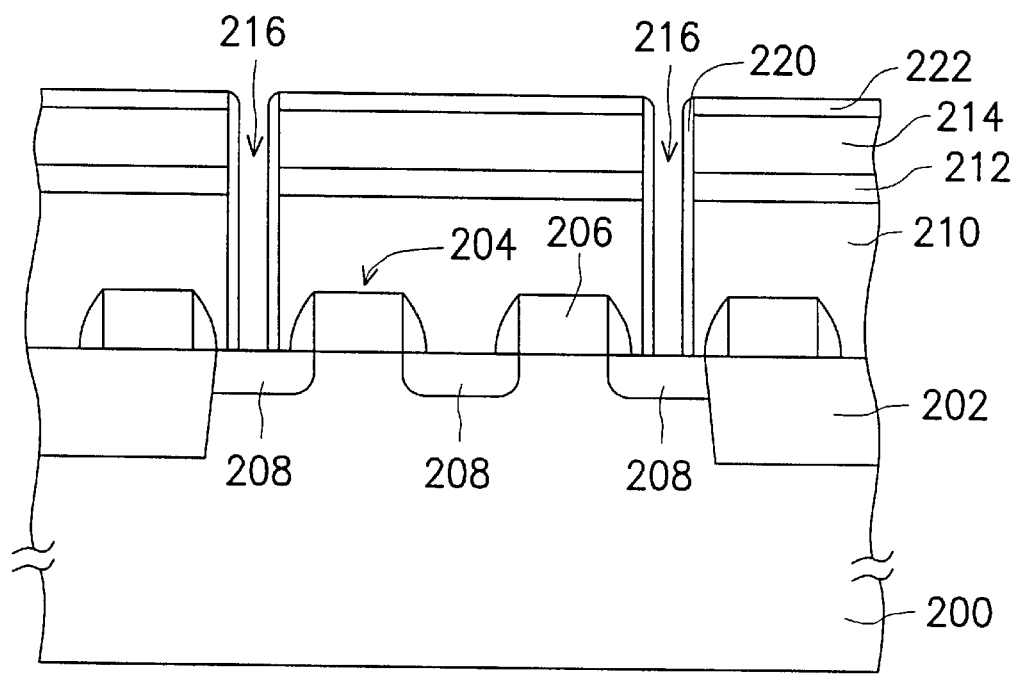

As shown in FIG. 2D, a portion of the conformal layer 218 is removed to expose the surfaces of the dielectric layer 214 and the portion of the source/drain region 208 exposed by the node contact hole 216. The remaining conformal layer 218 left on the sidewall of the node contact hole 216 is denoted as a liner layer 220. The material of the conformal layer 218, that is, of the liner layer 220, can prevent outgassing generated in the subsequent process. Preferably, the conformal layer 218 can be formed from silicon nitride or silicon-oxy-nitride by CVD, for example. The temperature for forming the conformal layer 218 is about of 600–800° C. and the preferred thickness of the conformal layer 218 is about of 30–200 angstroms, for example. The method for removing the portion of the conformal layer 218 includes a dry etching with etching gas $CHF_3$ or etching gas $NF_3$.

Since the surface of the dielectric layer 214 can be densified while the conformal layer 218 is formed at a high temperature, the purity of the surface of the dielectric layer 214 can be improved. Additionally, the etching gas can react with the surface of the dielectric layer 214 to form a restraining layer 222 on the dielectric layer 214 while the portion of the conformal layer 218 is removed. The restraining layer 222 can restrain the dielectric layer 214 from outgassing. Preferably, a rapid thermal process (RTP) is performed in an ammonia-filled environment to consolidate the quality of the restraining layer 222. The RTP can be performed at a temperature about of 800–900° C. for 30–120 seconds, for example.

Figure 2E:
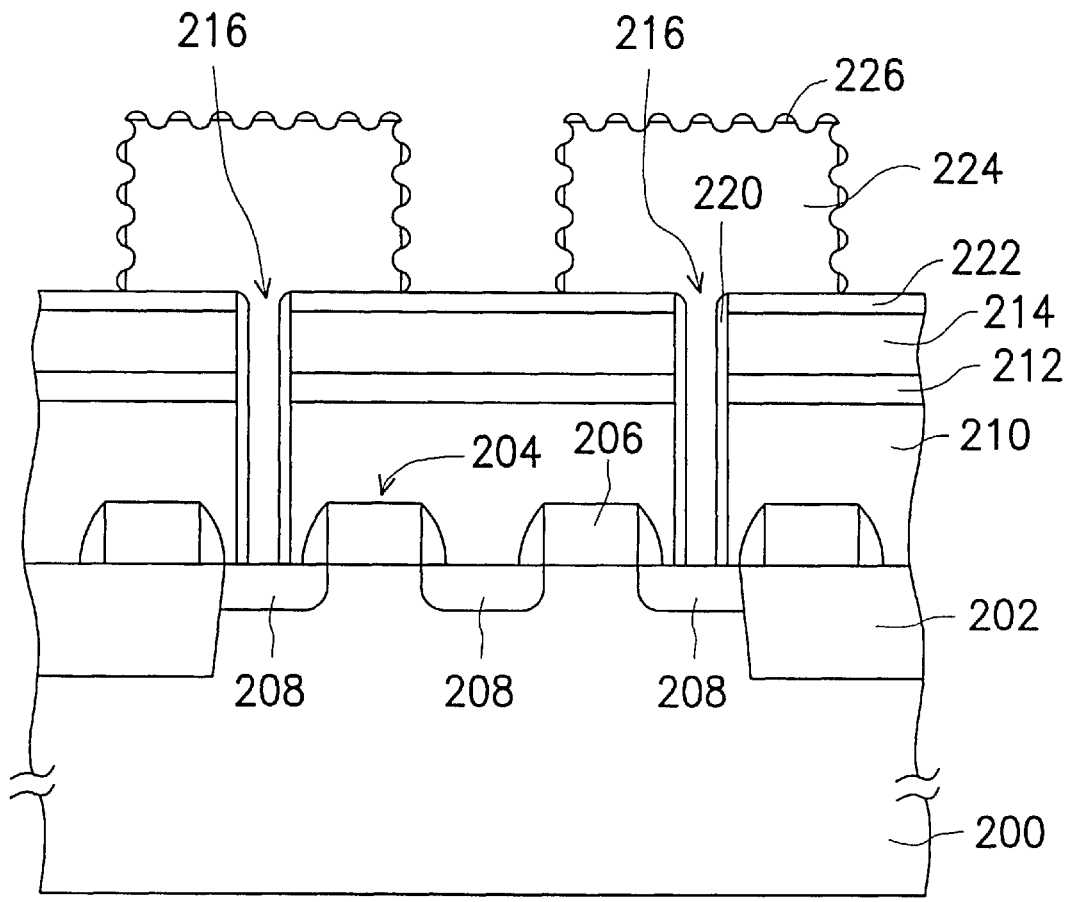

As shown in FIG. 2E, a patterned conductive layer 224 is formed on a portion of the restraining layer 222 and fills the node contact hole 216. The patterned conductive layer 224 is used as a bottom electrode of a capacitor (not shown). The material of the patterned conductive layer 224 can be amorphous silicon or doped amorphous silicon, for example. The dopants in doped amorphous silicon can be arsenic ions. In this example, the method for forming the patterned conductive layer 224 comprises the steps of forming an amorphous silicon layer (not shown) on the restraining layer 222 by CVD, wherein the amorphous silicon layer fills the node contact hole 216. The amorphous silicon layer is patterned to form the patterned conductive layer 224 and to expose a portion of the restraining layer 222. Thereafter, a selective HSG layer 226 is formed on the surface of the patterned conductive layer 224. The selective HSG layer 226 is used to increase the surface of the bottom electrode. Preferably, the method of forming the selective HSG layer 226 comprises seeding nuclei on the surface of the patterned conductive layer 224. In this step, silanes used as gas sources are fed into the furnace or the reaction chamber, and the silicon in the silanes and the patterned conductive layer 224 can be used as the nucleus seeds. After the density of the nuclei reaches a proper level, the gas source is no longer fed into the furnace or the reaction chamber and an annealing process is performed. Because the annealing process is performed, the silicon in the patterned conductive layer 224 can migrate and concentrate to form the selective HSG layer 226. Preferably, the seeding process and the annealing process are performed at a temperature about of 550–570° C. in the furnace or the reaction chamber.

Thereafter, a native oxide layer (not shown) formed on the selective HSG layer 216 or on the surface of the patterned conductive layer 224 is removed by hydrofluoric acid. Then, a dielectric layer (not shown) and a conductive layer (not shown) are formed over the substrate 200 in sequence to finish the process for manufacturing a capacitor.

In the invention, the cap layer 212 is formed between the dielectric layers 210 and 214. Since the etching rate of the cap layer 212 is different from those of the dielectric layers 210 and 214, the cap layer 212 can protect the dielectric layer 210 from etching by hydrofluoric acid when the native oxide layer formed on the selective HSG layer 216 and the patterned conductive layer 224 is removed by the etching process. Hence, the recess in the dielectric layer 210 caused by overetching will not happen. Moreover, the cap layer 212 can restrain charge penetration and charge migration along the dielectric layer 210, so that a gate oxide layer of the gate electrode 206 will not capture the charges. Accordingly, the gate electrode 206 can be prevented from collapsing.

Additionally, the cap layer 212, the liner layer 220 and the restraining layer 222 are formed to cover the surfaces of the dielectric layers 210 and 214. Because the material of the cap layer 212, the liner layer 220 and the restraining layer 222 can restrain outgassing from the dielectric layers 210 and 214 while the patterned conductive layer 224 and the selective HSG layer are formed, the vacuum quality in the furnace or the reaction chamber is not impaired. Consequently, the hemispherical grains of the HSG layer 224 are smaller, more densely placed, and substantially separate from each other. Hence, the capacitance of the bottom electrode of the capacitor is doubled by performing the invention.

Altogether, the invention includes following advantages:
1. The invention can prevent the dielectric layer from outgassing.
2. By using the invention, the hemispherical grains of the HSG layer are small, more densely placed, and substantially separate from each other.

3. The capacitance of the bottom electrode of the capacitor is doubled by performing the invention.

4. The invention can prevent the dielectric layer from forming recesses due to overetching the native oxide layer.

5. In the invention, the cap layer can restrain the charge penetration and the charge migration along the dielectric layer, so that a gate oxide layer of the gate electrode will not capture the charges. Accordingly, the gate electrode can be prevented from collapsing.

6. The invention can be used to perform highly integrated DRAM.

7. The present invention and the conventional process techniques are compatible; thus the present invention is suitable for use in current manufacturing processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a bottom electrode of a capacitor, comprising the steps of:

forming a first dielectric layer on a substrate;

forming a cap layer on the first dielectric layer;

forming a second dielectric layer on the cap layer;

forming a node contact hole to penetrate through the second dielectric layer, the cap layer and the first dielectric layer;

forming a conformal layer over the substrate by chemical vapor deposition;

removing a portion of the conformal layer using an etching gas to form a liner layer on the sidewall of the node contact hole and to react with the second dielectric layer to form a restraining layer on the second dielectric layer, simultaneously;

forming a patterned conductive layer on a portion of the restraining layer and filling the node contact hole; and forming a selective hemispherical grained layer on the patterned conductive layer.

2. The method of claim 1, wherein the cap layer can be formed from silicon nitride by chemical vapor deposition.

3. The method of claim 1, wherein the cap layer can be formed from silicon-oxy-nitride by chemical vapor deposition.

4. The method of claim 1, wherein material of the conformal layer can be selected from a group consisting of silicon nitride and silicon-oxy-nitride.

5. The method of claim 1, wherein the steps of forming the liner layer and the restraining layer further comprise the steps of:

performing a rapid thermal process in an ammonia-filled environment to consolidate the quality of the restraining layer.

6. The method of claim 5, wherein the rapid thermal process is performed at a temperature of about 800–900° C.

7. The method of claim 6, wherein the rapid thermal process is performed at a temperature of 800–900° C. for 30–120 seconds.

8. The method of claim 1, wherein material of the patterned conductive layer includes amorphous silicon.

9. The method of claim 1, wherein the etching gas comprises $CHF_3$.

10. The method of claim 1, wherein the etching gas comprises $NF_3$.

11. The method of claim 1, wherein the step of forming the selective hemispherical grained layer comprises:

performing a seeding process using silanes as a gas sources fed into a furnace or a reaction chamber to seed nuclei on the surface of the patterned conductive layer; and performing an annealing process wherein the gas source is no longer fed into the furnace or the reaction chamber.

12. The method of claim 1, wherein the seeding process and the annealing are performed at a temperature of 550–570° C.

13. A method of manufacturing a bottom electrode of a capacitor, comprising the steps of:

forming a first dielectric layer on a substrate;

forming a cap layer on the first dielectric layer;

forming a second dielectric layer on the cap layer;

forming a node contact hole to penetrate through the second dielectric layer, the cap layer and the first dielectric layer;

forming a conformal layer over the substrate;

removing a portion of the conformal layer to form a liner layer on the sidewall of the node contact hole and to form a restraining layer on the second dielectric layer, simultaneously;

performing a rapid thermal process in an ammonia-filled environment to consolidate the quality of the restraining layer;

forming a patterned conductive layer on a portion of the restraining layer and filling the node contact hole; and forming a selective hemispherical grained layer on the patterned conductive layer.

14. The method of claim 13, wherein the cap layer can be formed from silicon nitride by chemical vapor deposition.

15. The method of claim 13, wherein the cap layer can be formed from silicon-oxy-nitride by chemical vapor deposition.

16. The method of claim 13, wherein material of the conformal layer can be selected from a group consisting of silicon nitride and silicon-oxy-nitride.

17. The method of claim 13, wherein the rapid thermal process is performed at a temperature of about 800–900° C.

18. The method of claim 13, wherein material of the patterned conductive layer includes amorphous silicon.

19. The method of claim 13, wherein the rapid thermal process is performed at a temperature of 800–900° C. for 30–120 seconds.

20. The method of claim 13, wherein the step of forming the selective hemispherical grained layer comprises:

performing a seeding process using silanes as a gas source fed into a furnace or a reaction chamber to seed nuclei on the surface of the patterned conductive layer; and performing an annealing process wherein the gas source is no longer fed into the furnace or the reaction chamber.

* * * * *